United States Patent
Zhu et al.

(10) Patent No.: US 7,752,576 B2
(45) Date of Patent: Jul. 6, 2010

(54) DESIGN SUPPORT APPARATUS, DESIGN SUPPORT METHOD, AND COMPUTER PRODUCT FOR DESIGNING FUNCTION MODULE FROM SPECIFICATION DESCRIPTION

(75) Inventors: Qiang Zhu, Kawasaki (JP); Tsuneo Nakata, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 450 days.

(21) Appl. No.: 11/394,390

(22) Filed: Mar. 31, 2006

(65) Prior Publication Data
US 2006/0236289 A1    Oct. 19, 2006

Related U.S. Application Data

(63) Continuation of application No. PCT/JP03/13994, filed on Oct. 31, 2003.

(51) Int. Cl.
*G06F 17/50* (2006.01)

(52) U.S. Cl. .............. 716/1; 716/4; 716/11; 712/201; 717/131; 717/132; 717/155; 717/156

(58) Field of Classification Search .............. 716/1, 716/2, 4, 11; 703/14; 717/144, 156, 159, 717/160, 131, 132, 155; 712/201
See application file for complete search history.

(56) References Cited

U.S. PATENT DOCUMENTS

| | | | |
|---|---|---|---|
| 5,341,309 A | | 8/1994 | Kawata |
| 5,453,936 A | | 9/1995 | Kurosawa |
| 5,850,549 A | * | 12/1998 | Blainey et al. .............. 717/156 |
| 6,011,918 A | * | 1/2000 | Cohen et al. ................. 717/106 |
| 6,651,246 B1 | * | 11/2003 | Archambault et al. ....... 717/160 |
| 6,745,160 B1 | * | 6/2004 | Ashar et al. .................. 703/14 |
| 6,839,895 B1 | * | 1/2005 | Ju et al. ....................... 717/159 |
| 2002/0162097 A1 | * | 10/2002 | Meribout ..................... 717/155 |

(Continued)

FOREIGN PATENT DOCUMENTS

JP          5-89199          4/1993

(Continued)

OTHER PUBLICATIONS

Notice of Rejection dated Jul. 18, 2006.

(Continued)

*Primary Examiner*—Thuan Do
*Assistant Examiner*—Nha T Nguyen
(74) *Attorney, Agent, or Firm*—Staas & Halsey

(57) ABSTRACT

An input unit inputs specification description that includes a plurality of pieces of processing information each indicative of a processing performed by a design object and association information indicative of associations among the processing information. A node generating unit generates a node for each of the processing information. A link generating unit generates, based on the association information, a link that couples nodes generated by the node generating unit. A sub-chart generating unit configured to generate a plurality of sub-charts by dividing a chart indicating a content of the specification description, based on the node and the link. A function-module generating unit generates, for each of the sub-charts, a function module that executes a function based on the processing information corresponding to the node in the sub-chart and the association information corresponding to the link in the sub-chart.

11 Claims, 18 Drawing Sheets

U.S. PATENT DOCUMENTS

2003/0061576 A1* 3/2003 Saluja et al. ............... 716/2
2003/0226133 A1* 12/2003 Grover ..................... 717/140

FOREIGN PATENT DOCUMENTS

| JP | 5-108744 | 4/1993 |
| JP | 11-175578 | 7/1999 |
| JP | 2001-338004 | 12/2001 |
| JP | 2003-16125 | 1/2003 |

OTHER PUBLICATIONS

Zhu, Q. et al., "An object-oriented Design, Process for System-on-chip using UML", 15$^{TH}$ International symposium on Systems Synthesis, IEEE, Oct. 4, 2002, pp. 249-254.

Shu Kyo et al., "UML-o Mochiita System Level Sekkei Shuho no Teian", Information Processing Society of Japan, Jul. 22, 2002, vol. 2002, No. 10, pp. 49-54.

Masahiko Watanabe, "UML no Kumikomi System Muke Kakucho 'eUML' no-zenbo", Design Wave Magazine, CQ Publishing Co., Ltd., Dec. 1, 2001, vol. 6, No. 12, pp. 41-49.

Supplementary European Search Report, mailed Nov. 10, 2006, and issued in corresponding European Patent Application No. 03770082.0-2224.

Lagnese, E. D., et al., "Architectural Partitioning for System Level Synthesis of Integrated Circuits," IEEE Transactions on Computer-Aided Design of Integrated Circuits and Systems, IEEE Service Center, Jul. 1, 1991, vol. 10, No. 7, pp. 847-860.

Theissinger, M., et al., "Castle: An Interactive Environment for HW-SW Co-Design," Hardware/Software Codesign, Proceedings of the Third International Workshop on Grenoble, France, IEEE Computer Society, Sep. 22-24, 1994, pp. 203-209.

Mancoridis, S., et al., "Using Automatic Clustering to Produce High-Level System Organizations of Source Code," Program Comprehension, 1998. IWPC '98. Proceedings, 6$^{th}$ International Workshop on Ischia, Italy, IEEE Computer Society, Jun. 24-26, 1998, pp. 45-52.

Spiegel, A., "Object Graph Analysis," Freie Universität, Berlin, Germany, Jul. 1999, vol. B-99-11.

Hunt, G. C., et al., "The Coign Automatic Distributed Partitioning System," Technical Report MSR-TR-98-40, [Online], Feb. 1999. URL: ftp://ftp.research.microsoft.com/pub/tr/tr-98-40.ps> [retrieved on Oct. 20, 2006].

Hunt, G.C., et al., "A Guided Tour of the Coign Automatic Distributed Partitioning System," Enterprise Distributed Object Computing Workshop, 1998. EDOC '98. Proceedings. Second International, La Jolla, CA, USA, Nov. 3-5, 1998, New York, NY, USA, IEEE, US, Nov. 3, 1998, pp. 252-262.

* cited by examiner

FIG.2

```
void main(){
    Class1 object1;
    Class2 object2;

object1.O1(1,2 )
    int t = object1.O2();
    int g;
    bool s = object1.O3(10, g);
    object2.O4(t, s, g);
}
```

```
class Class1 {
    int q;
    void O1(int p1, int p2) {
        q = p1*p2;
    }
    int O2() {
        return q;
    }
    bool O3(int p1 ,int& p2) {
        p2 = (p1 > 10) ? 10: 20;
        if (p1 > 0)  return true;
        else return flase;
    }
};
class Class2 {
    int m;
    int O4(int p1, bool p2, int p3)
    {
        if (p2)  return m*p1*p3;
        else return 0;
    }
};
```

DESIGN SUPPORT APPARATUS, DESIGN SUPPORT METHOD, AND COMPUTER PRODUCT FOR DESIGNING FUNCTION MODULE FROM SPECIFICATION DESCRIPTION

This application is a continuing application, filed under 35U.S.C §111(a),of International Application PCT/JP2003/013664, filed Oct. 31, 2003.

BACKGROUND OF THE INVENTION

1. Field of the Invention

The present invention relates to a technology for supporting design of a large scale integration (LSI).

2. Description of the Related Art

Recently, as a scale of LSI design becomes larger, functions of a design target system has rapidly become complicate, and the LSI realizes wide range of circuits from a conventional single-function hardware circuit to a multifunction or combined-function circuit. Therefore, the LSI design is gradually shifted from a register transfer level (RTL) to a higher operation level, and, as is the case with software design, the LSI design is generally divided and performed in several phases, such as an analysis phase, a design phase, and an install phase.

In the analysis phase, the design target system is handled like a black box and a requirement analysis is performed without considering implementation. Since the analysis in the analysis phase is performed focusing on "what is produced", a data object processed by the design target system and the operation and attribute associated with each data object form basic components of the design target system.

A designer can perform the modeling of the processing flow of the data object to analyze the event flow of the design target system. A final result of the analysis phase is referred to as "requested specification description" here. In the design phase, division into parallel and concurrent function modules is performed by the designer in accordance with the requested specification description.

Since implementation is not considered in the analysis phase, the operation and attribute associated with the data is not necessarily divided into the same function modules. Such division into the function modules is performed based on long years of experience and intuition of the designer at present. For example, Japanese Patent Application Laid-Open Publication No. 2003-016125 discloses a designing method for dividing a logic circuit constituting LSI into a plurality of modules to perform hierarchical design.

FIG. 20 is a block diagram of a hardware configuration of a conventional design target system. As shown in FIG. 20, a design target system 2000 includes, for example, a processor 2001, a main memory 2002 such as a random access memory (RAM), other peripheral hardware modules 2011 to 2014, and a bus 2003 connecting these components, which realize various complicated functions in the design target system 2000.

In the conventional division into function modules, mapping is performed at the discretion of the designer to the function modules, which are meaningful function units. This mapping generally forms a configuration such that, for example, encrypted data, joint photographic experts group (JPEG) coder-decoder (CODEC) data, moving picture experts group (MPEG) CODEC data, or other processed data are stored in the main memory 2002 connected to the bus 2003 to start processing of the next module.

For example, a software function Func_SW( ) is mapped to the processor 2001 shown in FIG. 20 and the software function Func_SW( ) is assumed to include sub-functions f1( ), f2( ), f3( ). On the other hand, a hardware function Func_HW1( ) is mapped to the hardware Module 2011 and the hardware function Func_HW1( ) is assumed to include sub-functions g1( ), g2( ), g3( ). The hardware function Func_HW1( ) utilizes the sub-function f3( ) of the software function Func_SW( ). Specifically, the sub-function f3( ) of the software function Func_SW( ) reads data written by the sub-function g1( ) of the hardware function Func_HW1( ) to perform desired processing.

In such a case, when executing the sub-function f3( ) of the software function Func_SW( ), data are written by the sub-function g1( ) of the hardware function Func_HW1( ) from the hardware Module2011 into the main memory 2002 through the bus 2003. The data written into the main memory 2002 are read by the processor 2001 through the bus 2003. The sub-function f3( ) of the software function Func_SW( ) processes the read data and writes the data into the main memory 2002 again through the bus 2003, and the sub-function g1( ) of the hardware function Func_HW1( ) reads the data written into the main memory 2002 through the bus 2003.

The sub-function f3( ) of the software function Func_SW( ) may be preliminarily mapped. FIG. 21 is a block diagram of another example of the hardware configuration of the conventional design target system shown in FIG. 20. The same symbols are added to the same components as the configuration shown in FIG. 20, and description thereof is omitted. As shown in FIG. 21, the design target system 2000 includes a local memory 2004 connected to the hardware Module2011. The sub-function f3( ) of the software function Func_SW( ) shown in FIG. 20 is mapped to the hardware Module2011. Thus, when executing the sub-function f3( ), the data do not have to be transferred via the main memory 2002 and the bus 2003, and the data can be transferred between the hardware Module2011 and the local memory 2004.

However, in the design target system 2000 designed in accordance with the conventional module division shown in FIG. 20 described above, since going through the main memory 2002 and the bus 2003, a large amount of data must be transferred. Therefore, an enormous communication cost is generated between the processor 2001 and the hardware Module2011, thereby causing a problem in which overhead is generated and that the performance of the design target system 2000 is degraded.

In the design target system 2000 designed in accordance with the conventional module division shown in FIG. 21, since the sub-function f3( ) of the software function Func_SW( ) is merely one of many algorithms in the software function Func_SW( ), the designer cannot find out that the sub-function f3( ) is utilized in the processing of the sub-function g1( ) of the hardware function Func_HW1( ). Therefore, when the module division is performed based on the experience of the designer, it is very difficult to realize the optimum mapping as shown in FIG. 21.

Since the optimum division result is not necessarily obtained by the conventional module division, the final performance requirement of the design target system 2000 may not satisfy demand of customers in a footprint or power consumption, thereby causing a problem in which the credibility and quality of the LSI design is degraded.

In a design operation site, if some functions are frequently deleted or redesigned to prevent the degradation of the credibility and quality of the LSI design, the efficiency of the design operation is reduced and the LSI design period is prolonged.

SUMMARY OF THE INVENTION

It is an object of the present invention to at least solve the above problems in the conventional technology.

An apparatus for supporting design of a design object according to one aspect of the present invention includes an input unit configured to input specification description that includes a plurality of pieces of processing information each indicative of a processing performed by the design object and association information indicative of associations among the processing information; a node generating unit configured to generate a node for each of the processing information, the node with which a chart schematically indicating a content of the specification description is formed; a link generating unit configured to generate, based on the association information, a link that couples nodes generated by the node generating unit, the link with which the chart is formed; a sub-chart generating unit configured to generate a plurality of sub-charts by dividing the chart into a plurality of charts, based on the node and the link; and a function-module generating unit configured to generate, for each of the sub-charts, a function module that executes a function based on the processing information corresponding to the node in the sub-chart and the association information corresponding to the link in the sub-chart.

A method of supporting design of a design object according to another aspect of the present invention includes inputting specification description that includes a plurality of pieces of processing information each indicative of a processing performed by the design object and association information indicative of associations among the processing information; generating a node for each of the processing information, the node with which a chart schematically indicating a content of the specification description is formed; generating, based on the association information, a link that couples nodes generated by the node generating unit, the link with which the chart is formed; generating a plurality of sub-charts by dividing the chart into a plurality of charts, based on the node and the link; and generating, for each of the sub-charts, a function module that executes a function based on the processing information corresponding to the node in the sub-chart and the association information corresponding to the link in the sub-chart.

A computer-readable recording medium according to still another aspect of the present invention stores therein a computer program for realizing a method of supporting design of a design object according to the above aspect.

The other objects, features, and advantages of the present invention are specifically set forth in or will become apparent from the following detailed description of the invention when read in conjunction with the accompanying drawings.

BRIEF DESCRIPTION OF THE DRAWINGS

FIG. 2 is an explanatory diagram of an example of a specification description described in the C++ language;

DETAILED DESCRIPTION OF THE PREFERRED EMBODIMENTS

Exemplary embodiments of a design support apparatus, a design support method, a design support program, and a recording medium that records the program according to the present invention will be explained in detail with reference to the drawings.

Figure 1:
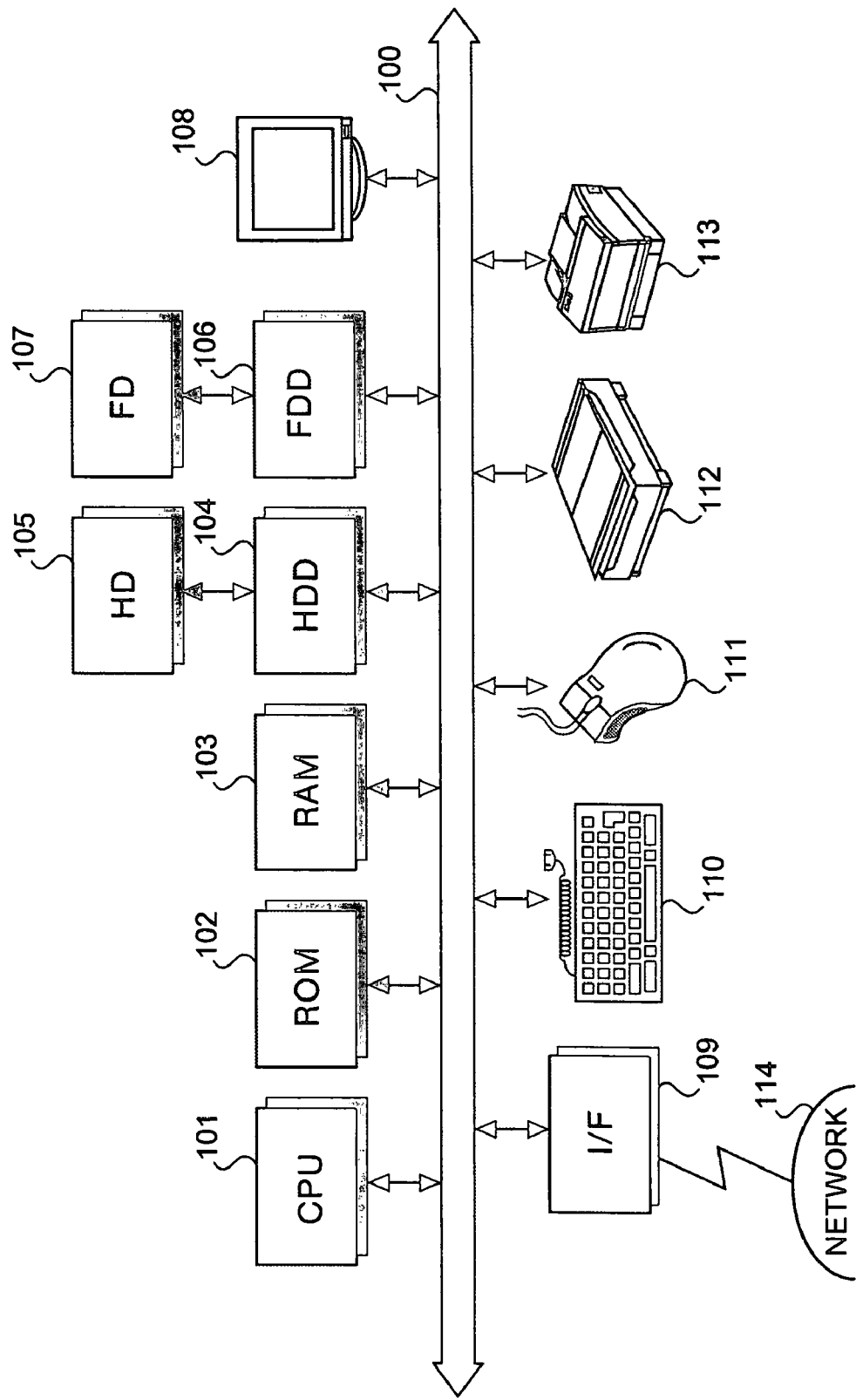
FIG. 1 is a block diagram of a hardware configuration of a design support apparatus according to an embodiment of the present invention.

FIG. 1 is a block diagram of a hardware configuration of the design support apparatus according to an embodiment of the present invention. As shown in FIG. 1, the design support apparatus includes a central processing unit (CPU) 101, a read-only memory (ROM) 102, a random access memory (RAM) 103, a hard disk drive (HDD) 104, a hard disk (HD) 105, a flexible disk drive (FDD) 106, a flexible disk (FD) 107 as an example of a removable recording medium, a display 108, an interface (I/F) 109, a keyboard 110, a mouse 111, a scanner 112, and a printer 113. The components are connected to each other through a bus 100.

The CPU 101 is responsible for overall control of the design support apparatus. The ROM 102 stores programs such as a boot program. The RAM 103 is used for a work area of the CPU 101. The HDD 104 controls read/write of data from/to the HD 105 under the control of the CPU 101. The HD 105 stores data written under the control of the HDD 104.

The FDD 106 controls read/write of data from/to the FD 107 under the control of the CPU 101. The FD 107 stores data written under the control of the FDD 106 and allows the design support apparatus to read the data stored in the FD 107.

As a removable recording medium, in addition to the FD 107, a compact-disc read-only memory (CD-ROM) (a compact-disc recordable (CD-R), a compact-disk rewritable (CD-RW)), a magneto optical (MO) disk, a digital versatile disk (DVD), and a memory card may be used. The display 108 displays a cursor, icons or tool boxes as well as data such as a document, an image, and function information. This display 108 may be, for example, a cathode ray tube (CRT), a thin film transistor (TFT) liquid crystal display, a plasma display, etc.

The I/F 109 is connected via a communication line to a network 114 such as the internet and is connected to other apparatuses via this network 114. The I/F 109 is responsible for interfacing the network 114 with the inside of the apparatus and controls input/output of data from/to an external apparatus. The I/F 109 may be, for example, a modem, a LAN adaptor, etc.

The keyboard 110 is provided with keys for entering characters, numeric characters, various instructions, etc. to enter data. A touch-panel type input pad, a numeric keypad, etc. may be used instead. The mouse 111 moves a cursor, selects an area or moves and resizes a window, etc. A trackball or joystick may be used instead, as long as similar functions for a pointing device are provided.

The scanner 112 reads an image optically and captures image data into the design support apparatus. The scanner 112 may have an OCR function. The printer 113 prints image data and document data. The printer 113 may be, for example, a laser printer or ink-jet printer.

The specification description is an analysis result of a requirement analysis without considering implementation of a design object such as LSI, which is obtained in an analysis phase of LSI design. The specification description is described in a predetermined computer-recognizable language. The specification description describes a plurality of pieces of processing information representing content of processing performed by the design object and association information representing associations in the plurality of pieces of the processing information. A specific example of the specification description will be described with reference to FIG. 2 and FIG. 3. FIG. 2 is an explanatory diagram of an example of the specification description described in the C++ language and FIG. 3 is an explanatory diagram of an example of the specification description with the same content as FIG. 2 described in the UML and the OCL.

A specification description 200 shown in FIG. 2 has a main function 201 and a subroutine 202. In this specification description 200, sets of data objects are represented by classes (Class1 and Class2). The class has an attribute and operations playing a role of a plurality of pieces of the processing information. For example, in the Class1, an integer-type (int) attribute q, operation O1, operation O2, and operation O3 exist. The operations 01 to 03 constitute an object 1, which is an object of the Class1. In the Class2, an integer-type attribute m and operation O4 exist. The operation O4 constitutes an object 2, which is an object of the Class2. In the main function 201 shown on the right of FIG. 2, class instances, i.e., data objects are generated and the calling orders (interactions) thereof are described.

Figure 3:
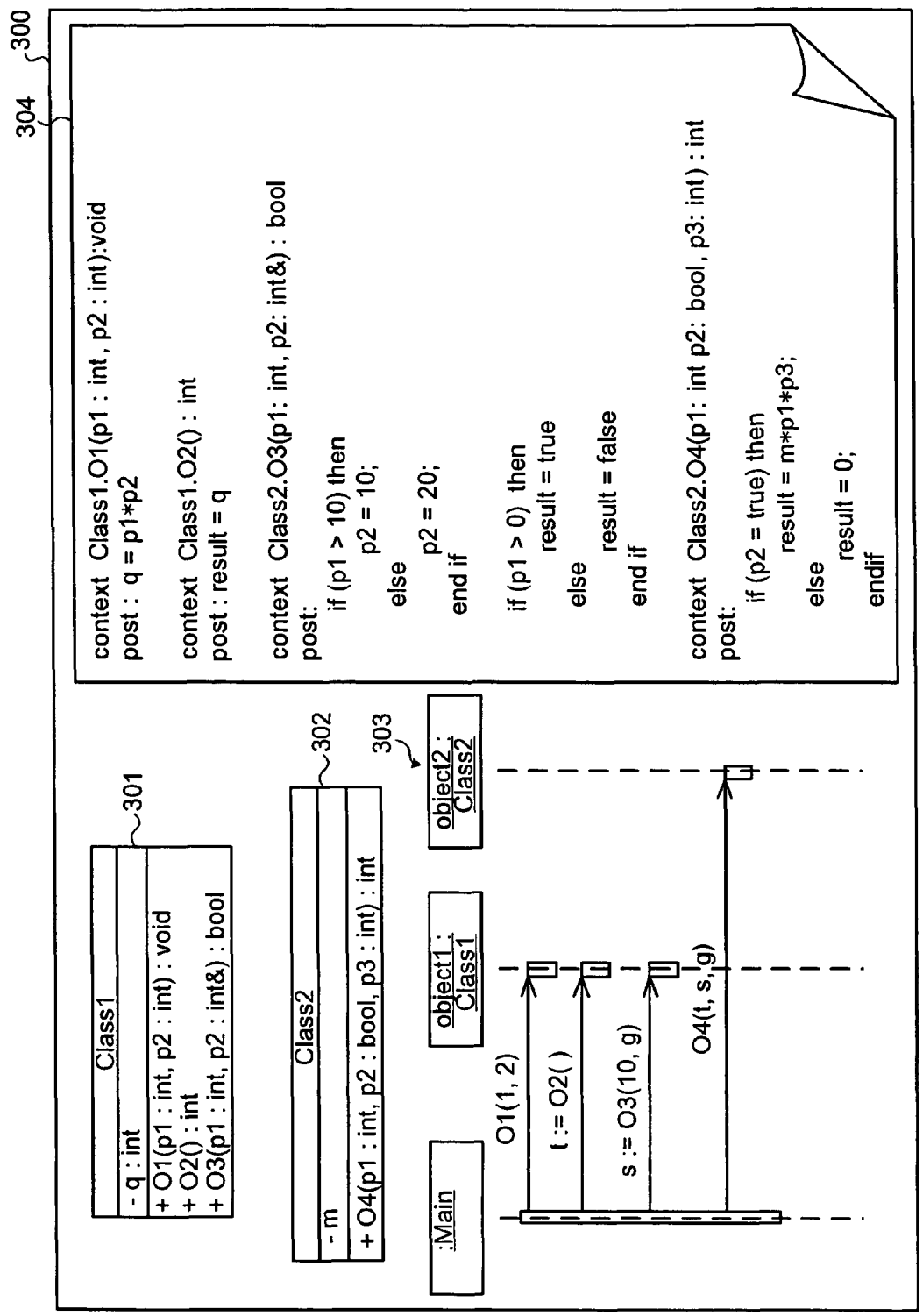
FIG. 3 is an explanatory diagram of an example of the specification description with the same content as the content shown in FIG. 2 described in the unified modeling language (UML) and the object constraint language (OCL)

Similarly, in a specification description 300 shown in FIG. 3, the Class1 and Class2 are represented using UML class diagrams 301, 302, respectively. The portion of the main function shown in FIG. 2 is represented using a sequence diagram 303 at the lower left of FIG. 3. However, since it is difficult to model the operation content with the UML diagrams 301 to 303, a post condition of the operation of each class can be defined using an OCL 304, which is also the specification description language, as shown on the right of FIG. 3. A specific example of the association information representing the associations in the plurality of pieces of the processing information will be described later.

Figure 4:
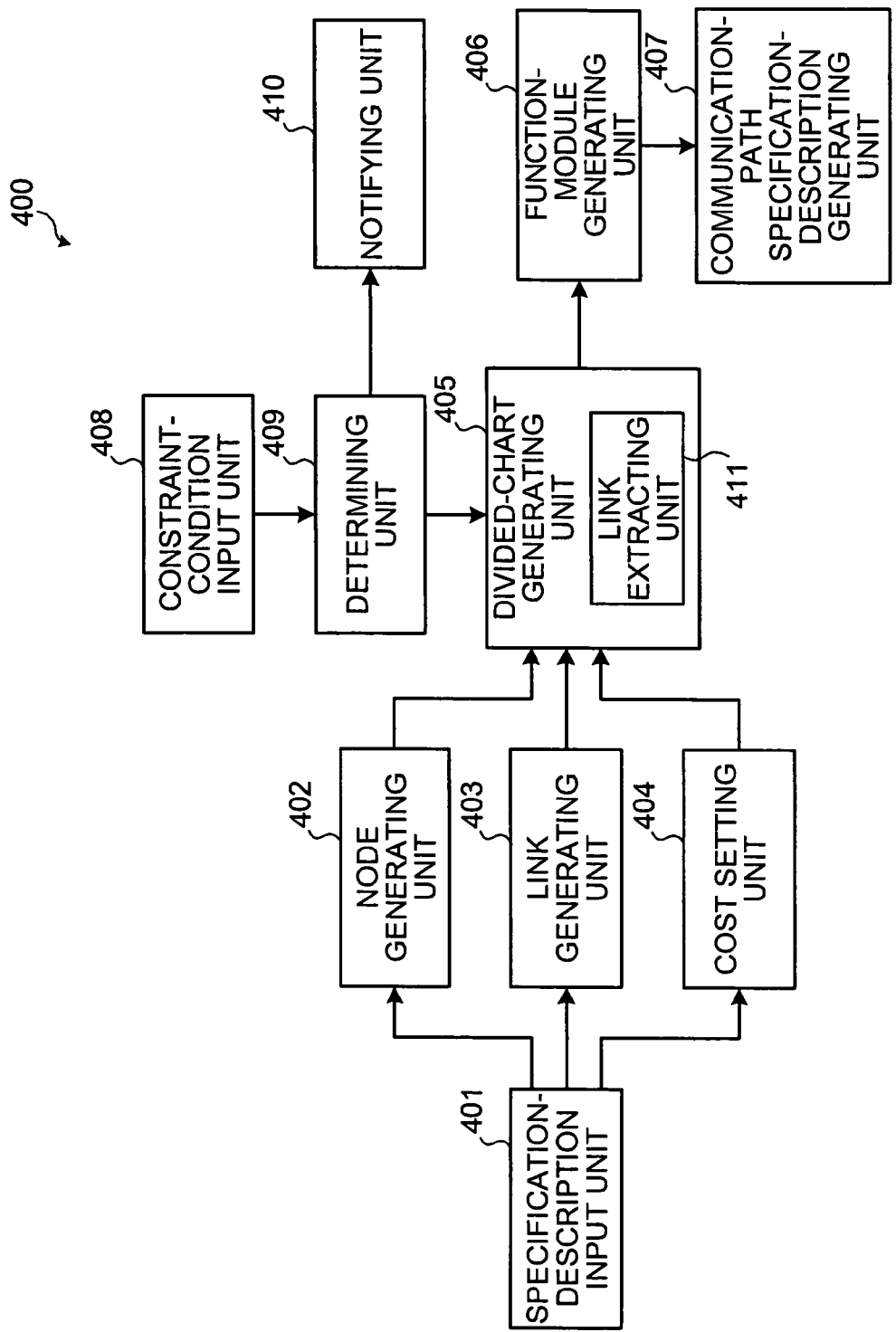
FIG. 4 is a block diagram of a functional configuration of the design support apparatus according to the embodiment of the present invention.

FIG. 4 is a block diagram of a functional configuration of the design support apparatus according to the embodiment of the present invention. As shown in FIG. 4, a design support apparatus 400 is configured to include a specification-description input unit 401, a node generating unit 402, a link generating unit 403, a cost setting unit 404, a divided-chart generating unit 405, a function-module generating unit 406, a communication-path specification-description generating unit 407, a constraint-condition input unit 408, a determining unit 409, and a notifying unit 410.

The specification-description input unit 401 inputs the specification description describing a plurality of pieces of processing information representing content of processing performed by a design object such as LSI and association information representing associations in the plurality of pieces of the processing information. Specifically, the specification-description input unit 401 inputs the specification description 200 described in the C++ language shown in FIG. 2 and the specification description 300 described with the UML diagrams 301 to 303 and the OCL 304 shown in FIG. 3 as described above.

Figure 5:
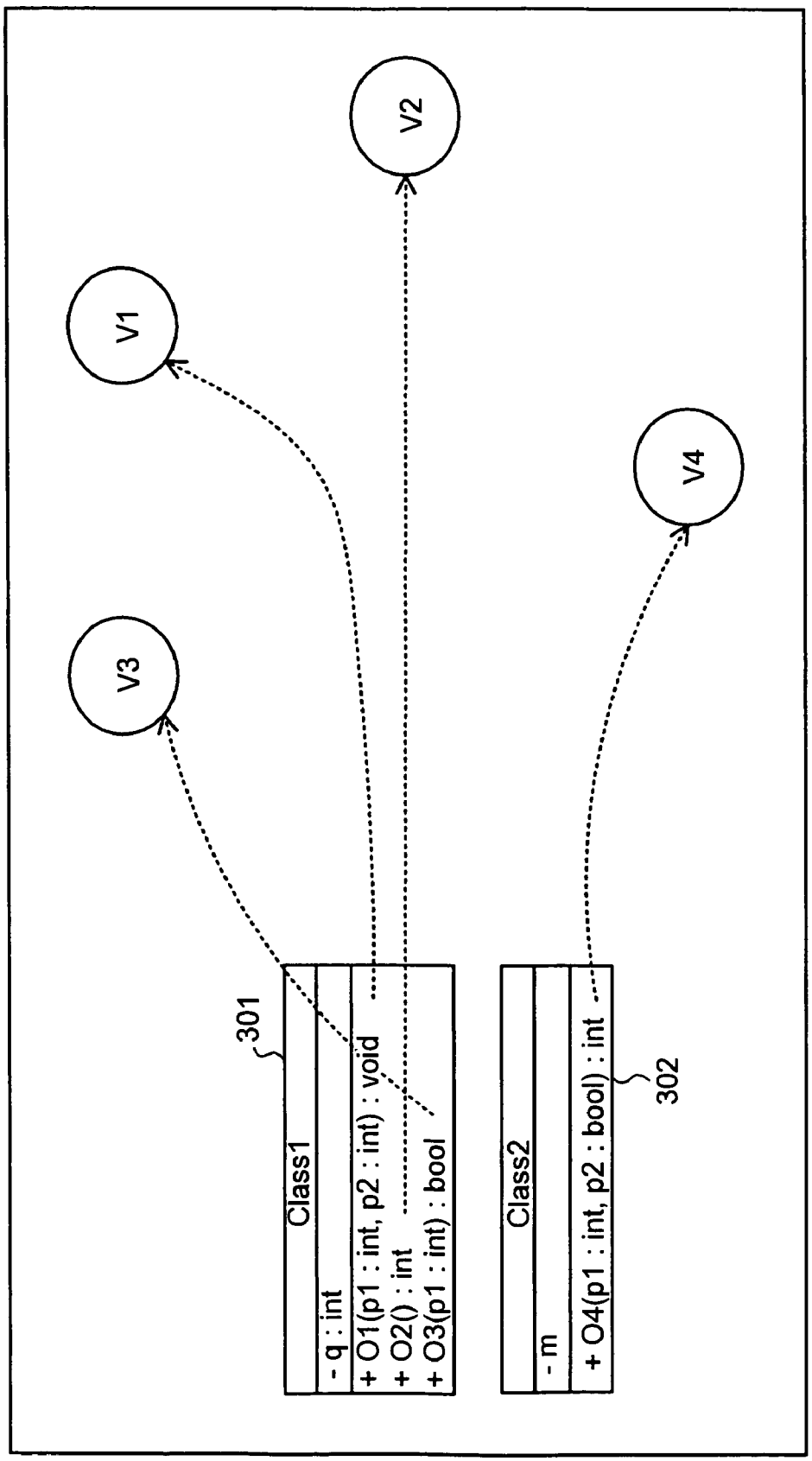
FIG. 5 is an explanatory diagram of an example of generating nodes from the specification description.

The node generating unit 402 generates a node for each of the plurality of pieces of the processing information input by the specification-description input unit 401. FIG. 5 is an explanatory diagram of an example of generating nodes from the specification description. In FIG. 5, the node generating unit 402 extracts the operations O1 to O4 included in the Class1 and the Class2 of the class diagrams 301, 302 and converts the extracted operations O1 to O4 into nodes V1 to V4. In this way, the nodes V1 to V4 can be generated.

Figure 6:
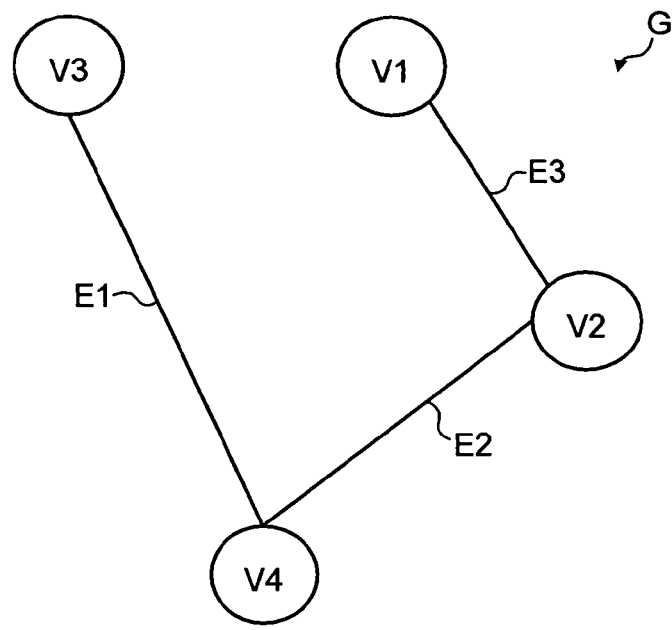
FIG. 6 is an explanatory diagram of an example of a chart schematically represented by the nodes shown in FIG. 5 and links.

The link generating unit 403 generates a link coupling a plurality of the nodes generated by the node generating unit 402, based on the association information input by the specification-description input unit 401. FIG. 6 is an explanatory diagram of an example of a chart schematically represented by the nodes shown in FIG. 5 and links. As described above, the association information is information representing the associations in the plurality of pieces of the processing information and can be represented by the presence of the association among various parameters of the data objects shown in FIGS. 2 and 3 or by the presence of the association among the operations O1 to O4 obtained from the delivery of the parameters, for example.

Specifically, with reference to the OCL 304 shown in FIG. 3, the operation O1 and the operation O2 access to the common attribute q and it can be known that an association exists between the operation O1 and the operation O2. With reference to the UML sequence diagram 303, a return value t obtained from the operation O2 of the Class1 and a return value s obtained from the operation O3 are delivered to the operation O4 of the Class2. Therefore, it can be known that an association exists between the operation O2, and the operation O4 and, similarly, it can be known that an association exists between the operation O3 and the operation O4.

In this way, since the association exists between the operation O1 and the operation O2, the link generating unit 403 can generate a link E3 coupling the node V1 generated from the operation O1 and the node V2 generated from the operation O2, as shown in FIG. 6. Since the association exists between the operation O2 and the operation O4, the link generating unit 403 can generate a link E2 coupling the node V2 generated from the operation O2 and the node V4 generated from the operation O4.

Since the association exists between the operation O3 and the operation O4, the link generating unit 403 can generate a link E1 coupling the node V3 generated from the operation O3 and the node V4 generated from the operation O4. By coupling the node V1 to node V4 with the link E1 to link E3, a graph G is generated as an example of a chart.

Figure 7:
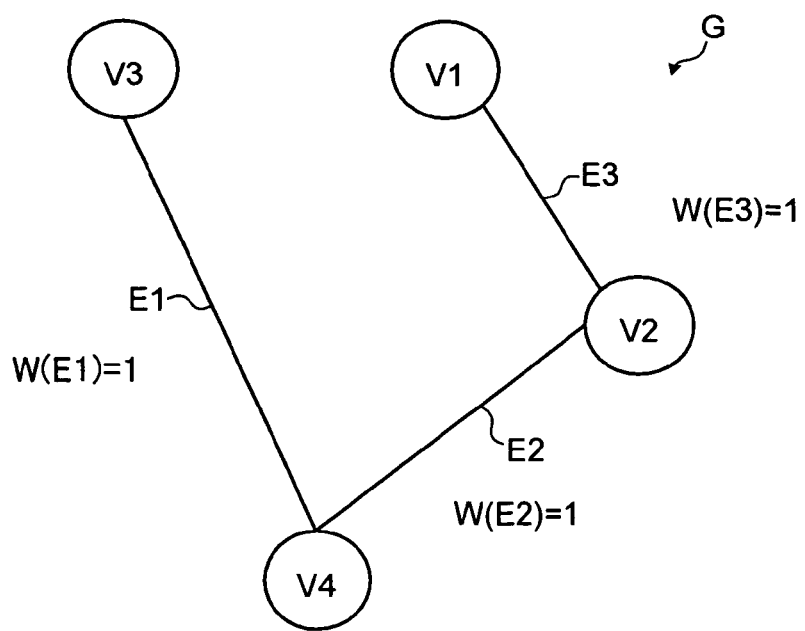
FIG. 7 is an explanatory diagram of an example (1) of setting costs for the links in the graph shown in FIG. 6.
Figure 8:
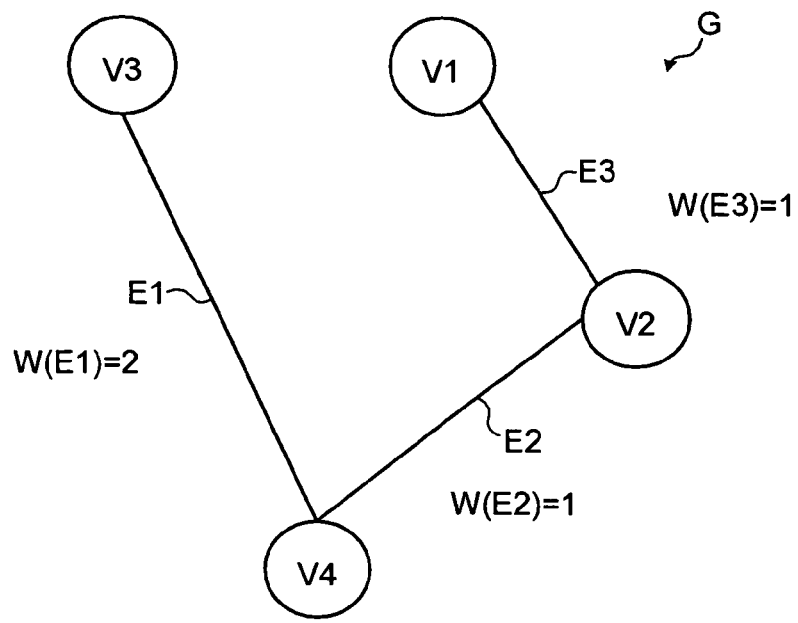
FIG. 8 is an explanatory diagram of an example (2) of setting costs for the links in the graph shown in FIG. 6.
Figure 9:
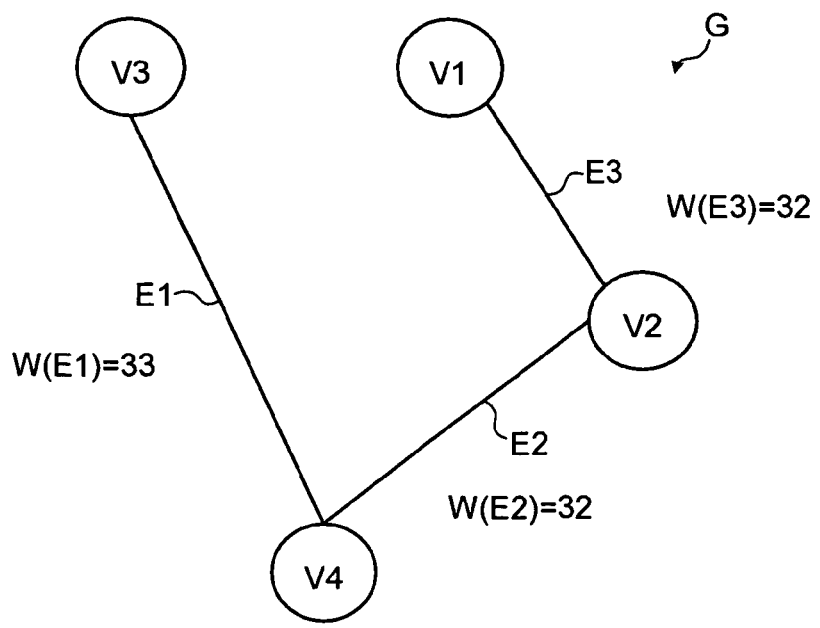
FIG. 9 is an explanatory diagram of an example (3) of setting costs for the links in the graph shown in FIG. 6.

The cost setting unit 404 sets costs indicating weights of links generated by the link generating unit 403, based on the specification description input by the specification-description input unit 401. FIGS. 7 to 9 are explanatory diagrams of examples of setting costs to the links E1 to E3 of the graph G shown in FIG. 6. For example, in an example of setting the costs is shown in FIG. 7, the costs of all the links E1 to E3 can be set to W(E)=1. In this way, the emphasis can only be on whether or not any nodes are coupled with the link.

The cost setting unit 404 can set the cost based on common variables used in common in the processing between pieces of the processing information corresponding to a pair of the nodes coupled by the link. For example, the cost setting unit 404 can set the cost based on the number of the common variables. Referring to FIGS. 2 and 3, q is the only common variable used in common in the processing between the operation O1 and the operation O2, i.e., a pair of pieces of the processing information. Therefore, In FIG. 8, with regard to the link E3 coupling the node V1 and the node V2 corresponding to the operation O1 and the operation 02, the weight W(E3) can be set to W(E3)=1.

In the processing between the operation O2 and the operation O4, t is the only common variable used in common. Therefore, as shown in FIG. 8, with regard to the link E2 coupling the node V2 and the node V4 corresponding to the operation O2 and the operation O4, the weight W(E2) can be set to W(E2)=1.

In the processing between the operation O3 and the operation O4, s and g are two common variables used in common. Therefore, as shown in FIG. 8, with regard to the link E1 coupling the node V3 and the node V4 corresponding to the operation O3 and the operation O4, the weight W(E1) can be set to W(E1)=1.

The cost setting unit 404 can set the cost based on a bit length of the common variable used in common in the processing between pieces of the processing information corresponding to a pair of the nodes coupled by the link.

For example, in the processing between the operation O1 and the operation O2, the common variable q used in common is the integer type (int) and, thus, the bit length is 32 bits. Therefore, in FIG. 9, with regard to the link E3 coupling the node V1 and the node V2 corresponding to the operation O1 and the operation O2, the weight W(E3) can be set to W(E3)=32.

In the processing between the operation O2 and the operation O4, the common variable t used in common is also the integer type and, thus, the bit length is 32 bits. Therefore, as shown in FIG. 9, with regard to the link E2 coupling the node V2 and the node V4 corresponding to the operation O2 and the operation O4, the weight W(E2) can be set to W(E2)=32.

In the processing between the operation O3 and the operation O4, two common variables used in common exist. One parameter q is the integer type (int) and, thus, the bit length is 32 bits. The other parameter g is a Boolean type (bool) and, thus, the bit count is one bit. Therefore, in FIG. 9, with regard to the link E1 coupling the node V3 and the node V4 corresponding to the operation O3 and the operation O4, the weight W(E1) can be set to W(E1)=32+1=33.

In the divided-chart generating unit 405, sub-graphs, i.e., a plurality of divided charts are generated by dividing the graph G, which is the chart of the specification description schematically, based on the nodes V1 to V4 generated by the node generating unit 402 and the links E1 to E3 generated by the link generating unit 403.

The divided-chart generating unit 405 is provided with a link extracting unit 411. The link extracting unit 411 extracts a link with a minimum cost set by the cost setting unit 404. For example, from the graph G shown in FIG. 7, all the links E1 to E3 are extracted. From the graph G shown in FIG. 8, the links E2 and e3 are extracted. From the graph G shown in FIG. 9, the links E2 and e3 are extracted. Specifically, the extraction of the links is performed by a Min-Cut algorithm described later.

The divided-chart generating unit 405 can generate the sub-graphs, i.e., a plurality of divided charts based on the links extracted by the link extracting unit 411. Into this division processing, the Min-Cut algorithm can be introduced.

Description will be made of an example of introducing the Min-Cut algorithm to perform the division processing. The Min-Cut is to divide a set V of the nodes of the graph G into two subsets S and T when an undirected graph G=(V, E) is given. The Min-Cut can cut the link with the minimum weighting cost between the subsets S and T of the nodes V. In this way, a resolution can be obtained in $O(2n \cdot \log n)$ time. n is the number of the nodes.

Figure 10:
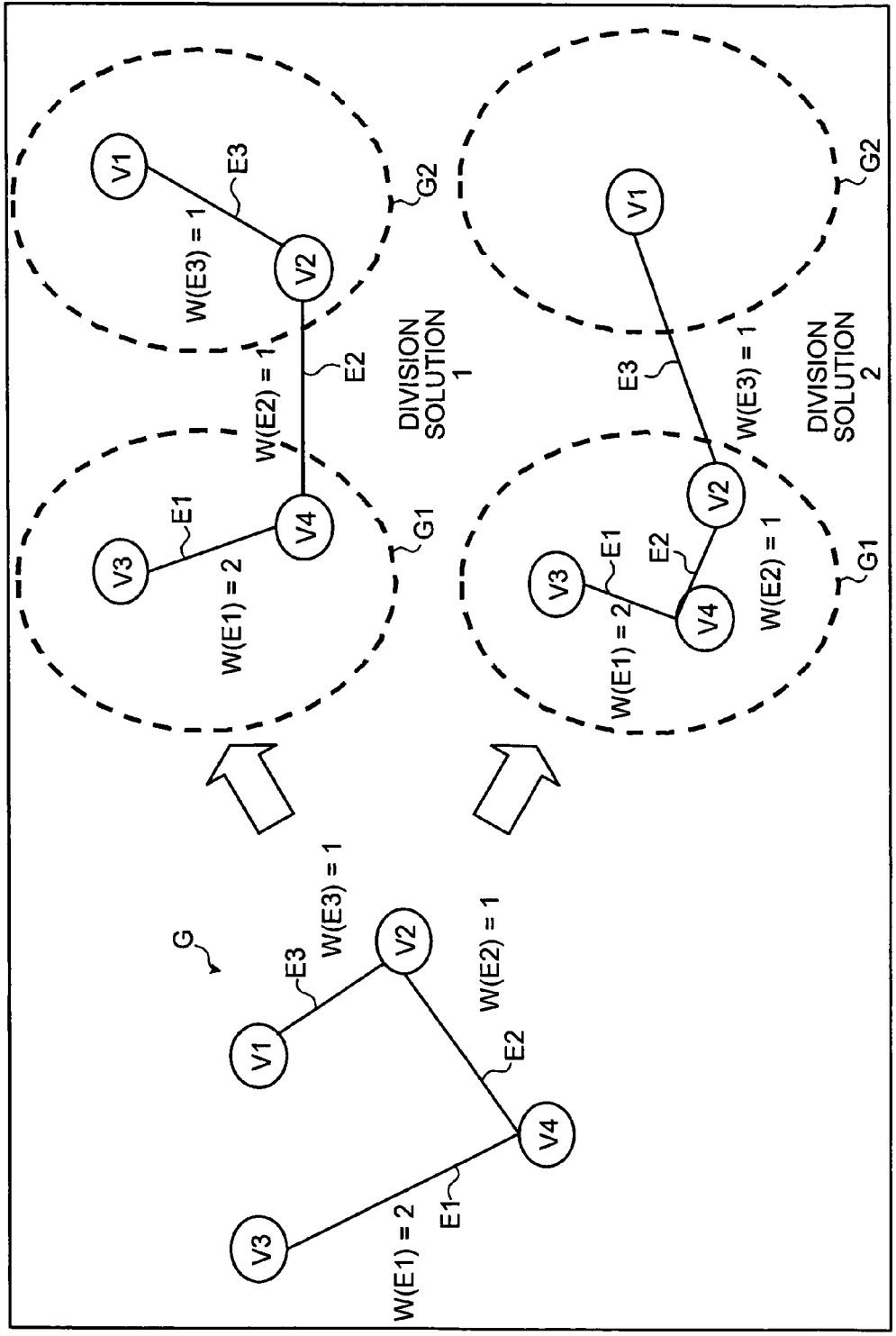
FIG. 10 is an explanatory diagrams of division solutions obtained from the graph shown in FIG. 8.

FIG. 10 is an explanatory diagram of division solutions obtained from the graph shown in FIG. 8. As shown in FIG. 10, the graph G shown in FIG. 8 shows an example of division of the graph when the costs of the link E1 to link E3 are set depending on the number of parameters. When introducing the Min-Cut algorithm, since the link E2 or link E3 having the minimum cost is cut, two division solutions exist.

Since the link E2 is cut in the division solution 1, a sub-graph G1 is constituted by the node V3, the node V4, and the link E1, and a sub-graph G2 is constituted by the node V1, the node V2, and the link E3. On the other hand, since the link E3 is cut in the division solution 2, a sub-graph G1 is constituted by the node V2, the node V3, the node V4, the link E1, and the link E2, and a sub-graph G2 is constituted by the node V1. Since the link coupling the sub-graphs G1 and G2 has the minimum cost, both the division solution 1 and the division solution 2 are correct answers.

Figure 11:
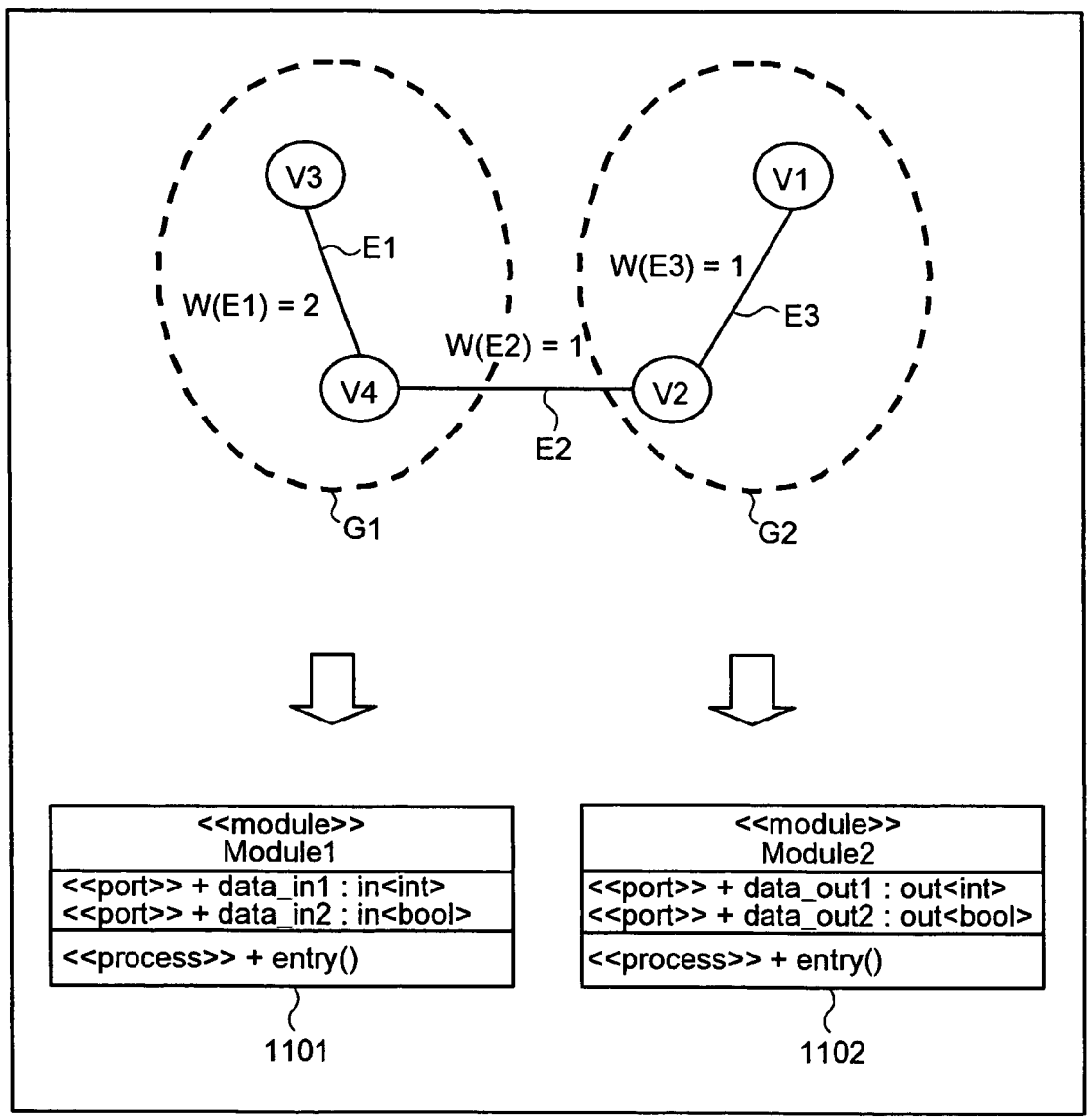
FIG. 11 is an explanatory diagram of an example of generating a function module from each sub-graph of the division solution shown in FIG. 10.

The function-module generating unit 406 generates a function module executing a function based on the processing information corresponding to the nodes and the association information corresponding to the links in each divided chart for each of a plurality of the divided charts generated by the divided-chart generating unit 405. FIG. 11 is an explanatory diagram of an example of generating a function module from each of the sub-graphs G1, G2 of the division solution 1 shown in FIG. 10.

As shown in FIG. 11, the sub-graph G1 is compiled into a function Module1 represented by a UML class diagram 1101 and the sub-graph G2 is wrapped up into a function Module2 represented by a UML class diagram 1102. In the class diagrams 1101, 1102, a <<module>> stereotype indicates that a relevant class is a module. A <<process>> stereotype indicates that the operation of the module is a process. A <<port>> stereotype indicates a port for communication between the modules.

In the function module Module1, the operation O3 of the Class1 and the operation O4 of the Class2 are compiled into entry ( ) of a process <<process>> of the function module Module1, since the sub-graph G1 includes the nodes V3, V4.

Similarly, in the function module Module2, the operation O1 and the operation O2 of the Class1 are compiled into entry ( ) of a process <<process>> of the function module Module2, since the sub-graph G2 includes the nodes V1, V2.

From the specification description 200 and 300 shown in FIGS. 2 and 3, ports for communication between the function module Module1 and the function module Module2 can be determined since two parameters are communicated between the function module Module1 and the function module Module2. The function module Module1 is assigned with data_in1 and data_in2. The respective data types are represented by in <int> and in <bool>. In <type> indicates the input side.

The function module Module2 is provided with ports of data_out1 and data_out2. The respective data types are represented by out<int> and out<bool>. Out<type> represents the output side.

Figure 12:
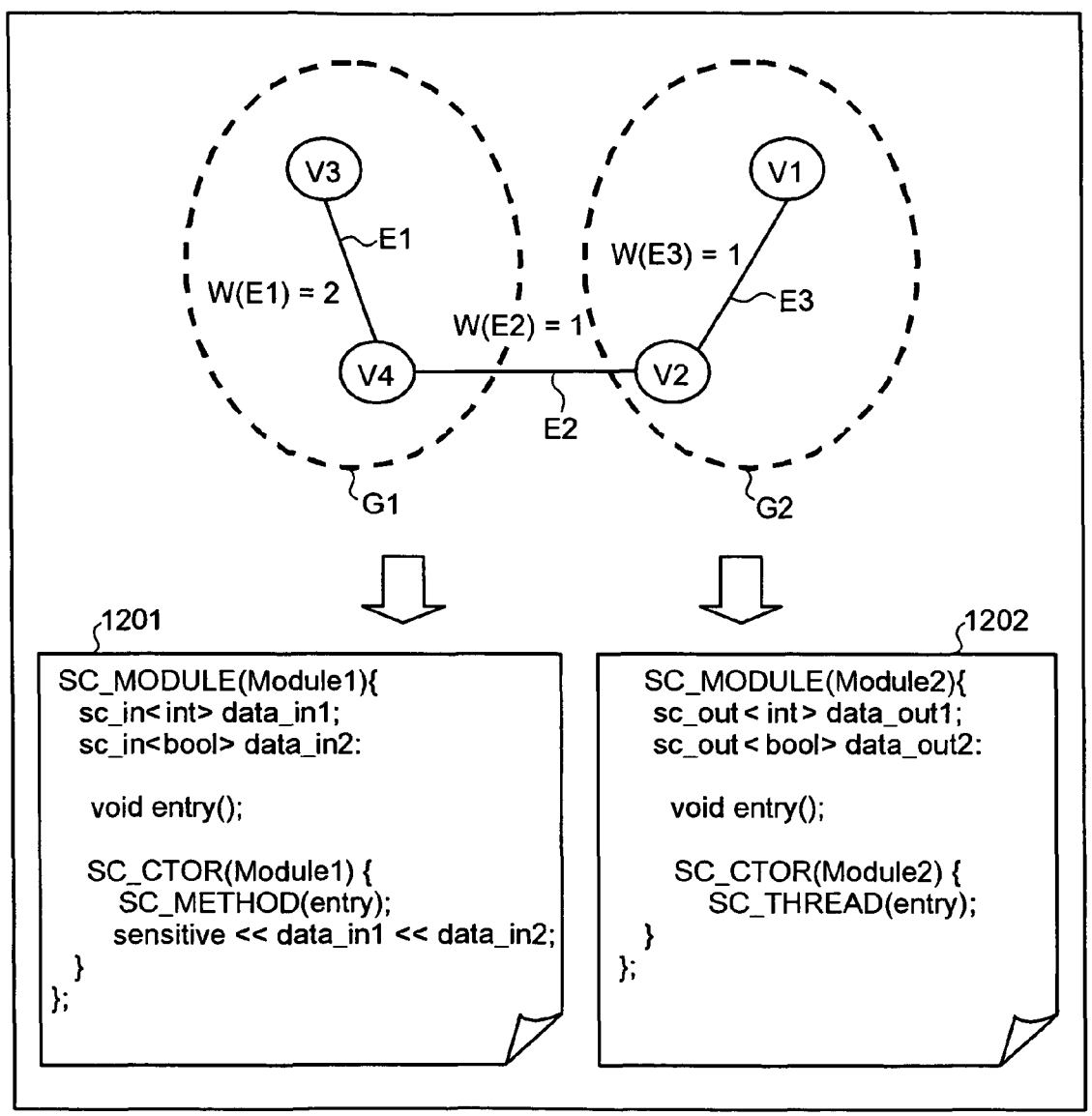
FIG. 12 is an explanatory diagram of an example of representing the same content as the content shown in FIG. 11 with the System C.

FIG. 12 is an explanatory diagram of an example of representing the same content as FIG. 11 with System C 1201, 1202. In FIG. 12, an SC_MODULE( ) macro defines a function module. SC_CTOR represents a portion to be regarded as processing. SC_METHOD and SC_THREAD indicate processes. Module2 is expressed by SC_THREAD since an input port does not exist.

Figure 13:
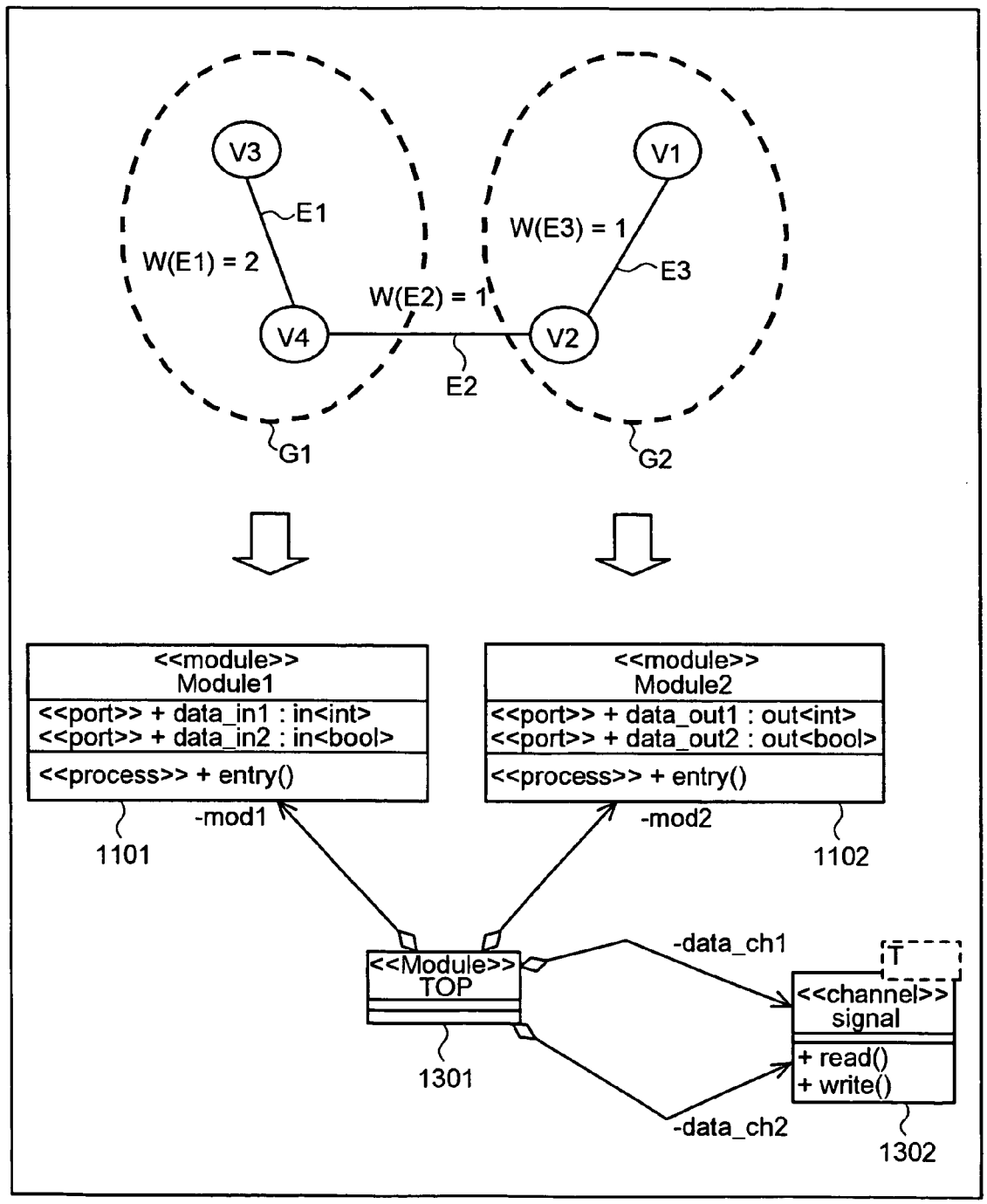
FIG. 13 is an explanatory diagram of a specification description for a communication path generated between the function modules shown in FIG. 12.

The communication-path specification-description generating unit 407 generates the specification description for a communication path connecting a plurality of the function modules based on the plurality of function modules generated by the function-module generating unit 406. FIG. 13 is an explanatory diagram of the specification description for a communication path generated between the function modules shown in FIG. 12. In FIG. 13, when the ports of the function module Module1 and the function module Module2 are revealed by the generation of the function modules, the specification description and a top module can also be generated for a communication path between the function modules. A class diagram 1101 (TOP) can also be generated which is represented by a <<module>> stereotype integrating the Module1 and the Module2. A Class1302 (signal) can be generated which is represented by a communication path <<channel>> stereotype. In this way, the level of the completion of design can be enhanced.

The constraint-condition input unit 408 inputs a constraint condition constraining the number of generation of the divided charts generated by the divided-chart generating unit 405. An example of the constraint condition can be the number of the divided charts equal to a predetermined number, equal to or less than a predetermined number, equal to or more than a predetermined number, or equal to or more than a predetermined number as well as equal to or less than a predetermined number, for example.

The constraint-condition input unit 408 can input a constraint condition constraining the number of the nodes included in a plurality of the divided charts generated by the divided-chart generating unit 405. An example of the constraint condition can be the number of the nodes included in the divided charts equal to a predetermined number, equal to or less than a predetermined number, equal to or more than a predetermined number or more, or equal to or more than a predetermined number as well as equal to or less than a predetermined number, for example.

The constraint-condition input unit 408 can input a constraint condition that includes content for including any plurality of pieces of processing information in one function module or content for not including any plurality of pieces of processing information in one function module. For example, the constraint-condition input unit 408 can input a constraint condition for including the operation O1 and the operation O2 to the same function module or a constraint condition for not including the operation O2 and the operation O3 to the same function module.

The determining unit 409 determines whether or not the divided charts generated by the divided-chart generating unit 405 satisfy the constraint condition input by the constraint-condition input unit 408. In this case, the divided-chart generating unit 405 divides a graph, i.e., a chart into sub-graphs, i.e., a plurality of divided charts based on the determination result determined by the determining unit 409.

Figure 14:
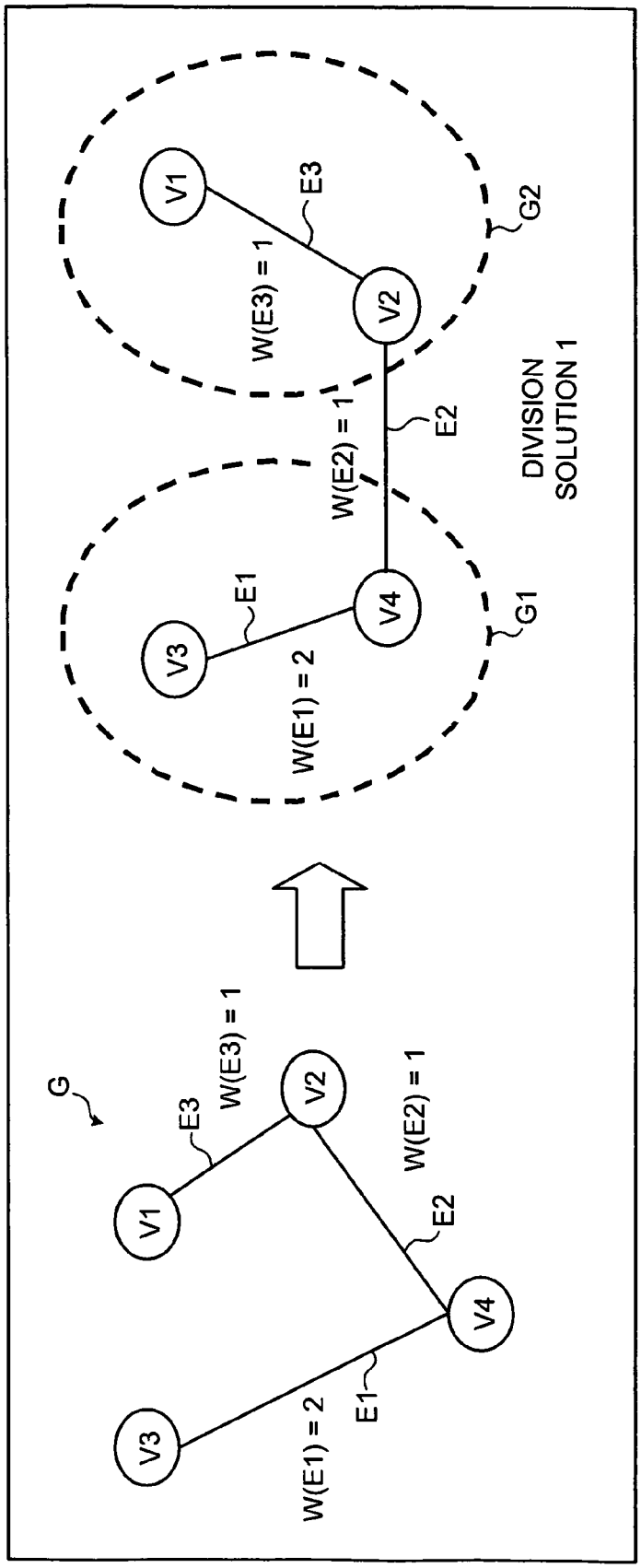
FIG. 14 is an explanatory diagram of an example of dividing into sub-graphs in conformity to a constraint condition.

FIG. 14 is an explanatory diagram of an example of dividing into the sub-graphs in conformity to the constraint condition. FIG. 14 illustrates one division solution 1 of the two division solution shown in FIG. 10. When the number of the sub-graphs is two and the number of the nodes included in the sub-graph is two in the constraint condition, the division solution 2 shown in FIG. 10 will be excluded and only the division solution 1 will be a correct answer.

If the determining unit 409 determines that the constraint condition is not satisfied, the notifying unit 410 notifies that the division into the divided charts is impossible. Specifically, for example, the notification is performed by displaying this content on the display 108 shown in FIG. 1.

With regard to the specification-description input unit 401, the node generating unit 402, the link generating unit 403, the cost setting unit 404, the divided-chart generating unit 405, the function-module generating unit 406, the communication-path specification-description generating unit 407, the constraint-condition input unit 408, the determining unit 409, the notifying unit 410, and the link extracting unit 411, specifically, for example, the functions thereof are realized by executing programs recorded on the ROM 102, the RAM 103, the HD 105, the FD 107 etc. shown in FIG. 1 with the CPU 101 or by the I/F 109.

Figure 15:
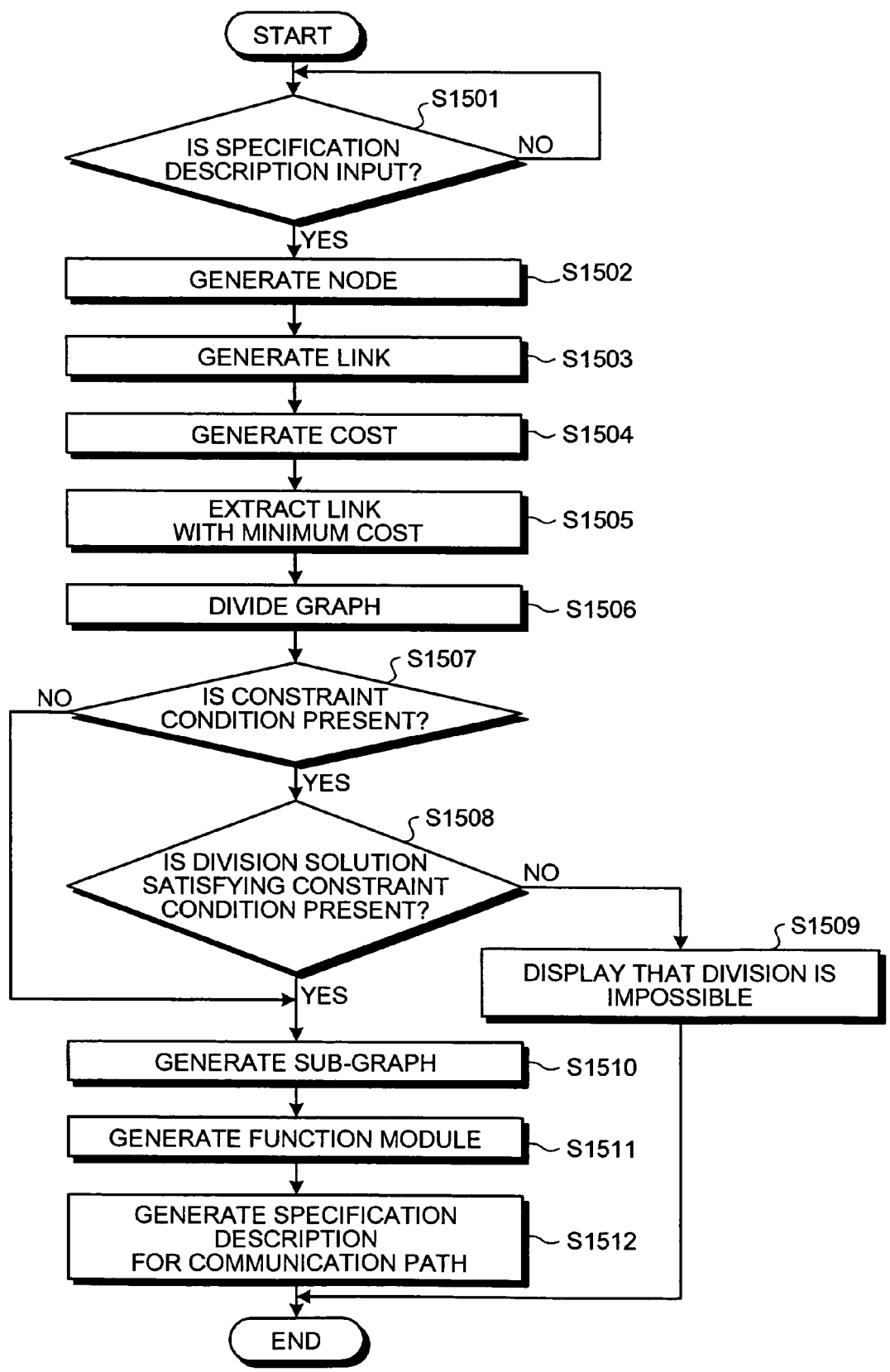
FIG. 15 is a flowchart of a design support processing of the design support apparatus according to the embodiment of the present invention.

FIG. 15 is a flowchart of a design support processing of the design support apparatus according to the embodiment of the present invention. As shown in FIG. 15, when the specification description 200, 300 shown in FIGS. 2 and 3 is input (step S1501: YES), the nodes are generated from the processing information described in the specification description 200, 300 (step S1502). The links and the costs thereof are generated from the association information described in the specification description (step S1503, step S1504). In this way, the graph G is generated which is constituted by the nodes V and the links E.

The link with the minimum cost is extracted from the graph G by the Min-Cut algorithm (step S1505) and the graph G is divided by cutting the extracted link (step S1506). If the constraint condition does not exist (step S1507: NO), the sub-graphs are generated from the division solutions (step S1510). On the other hand, if the constraint condition exists (step S1507: NO), it is determined whether or not a division solution satisfying the constraint condition exists in the division solutions (step S1508). If the satisfying division solution does not exist (step S1508: NO), it is displayed that the graph G cannot be divided (step S1509).

On the other hand, if the satisfying division solution exists (step S1508: YES), the sub-graphs are output from the division solution (step S1510). The function modules are generated from the output sub-graphs (step S1511) and the specification description is generated for the communication path between the function modules (step S1512).

According to the design support apparatus 400, since the optimum division result of the function modules can be automatically obtained, optimum LSI design can be performed regardless of yeas of experience and a skill level of an LSI designer.

Figure 16:
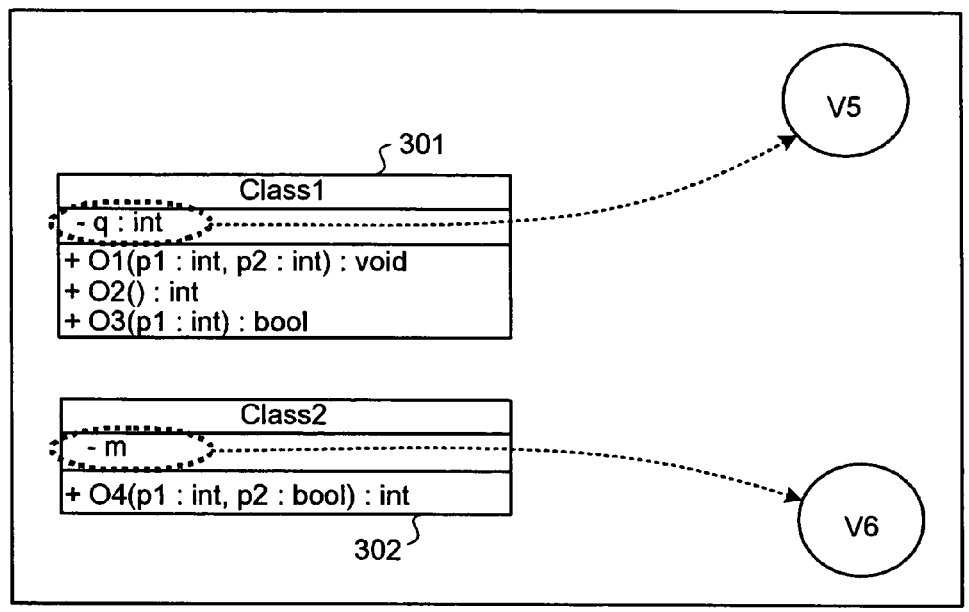
FIG. 16 is an explanatory diagram of another example of the node generation of the design support apparatus according to the embodiment of the present invention.

Although the node generating unit 402 extracts the operations O1 to O4 included in the Class1 and the Class2 of the class diagram shown in FIG. 3 to convert the extracted operations O1 to O4 into the nodes V1 to V4 in the embodiments described above, a node V5 and a node V6 may be generated by extracting the attribute q and the attribute m included in the Class1 and the Class2 playing a role of the plurality of pieces of the processing information input into the specification-description input unit 401, as shown in FIG. 16. In this way, the division into the sub-groups can be performed in units of the attribute.

Figure 17:
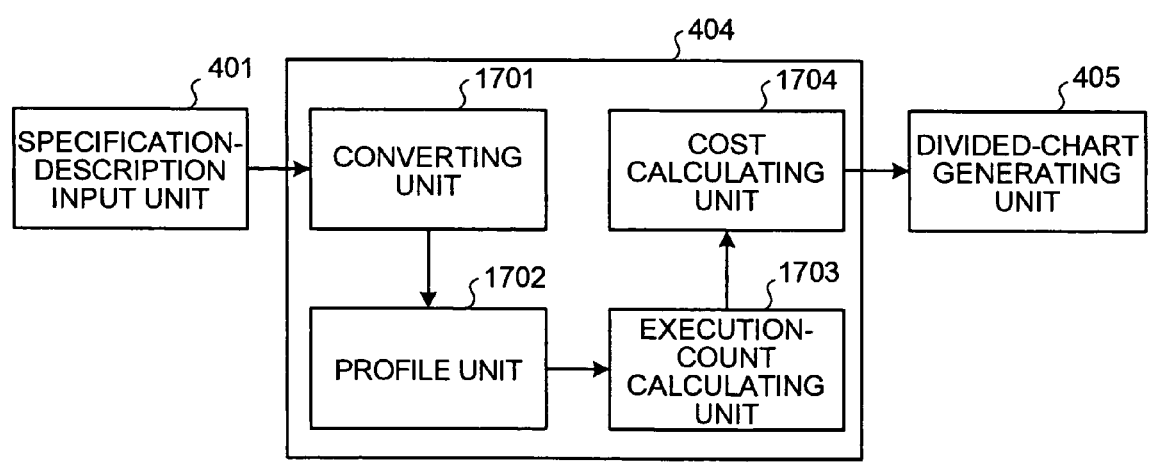
FIG. 17 is a block diagram of a functional configuration of a cost setting unit in this case.

Although the cost setting unit 404 sets all the costs using static analyses, the cost can be set with the use of dynamic analyses by executing the specific description 200 itself described in the C++ language shown in FIG. 2. In this way, an executable execution profile of the specification description 200 can be acquired to obtain the number of calls of operations dependent on external inputs. FIG. 17 is a block diagram of a functional configuration of the cost setting unit in this case.

In FIG. 17, the cost setting unit 404 is provided with a converting unit 1701, a profile unit 1702, an execution-count calculating unit 1703, and a cost calculating unit 1704. The converting unit 1701 converts the specification description input by the specification-description input unit 401 into an executable model using a program language. Specifically, the specification description 200 described in the C++ language is compiled to an executable model by a compiler such as gcc_pg. The profile unit 1702 profiles the executable model with a profiler such as a free command gprof. The execution-count calculating unit 1703 calculates the number of times of execution of the processing information (e.g., operation O1 to operation O4) represented by the nodes V. The cost calculating unit 1704 calculates the cost by summing the number of times of execution of the processing information represented by a pair of nodes V coupled by the link E.

Figure 18:
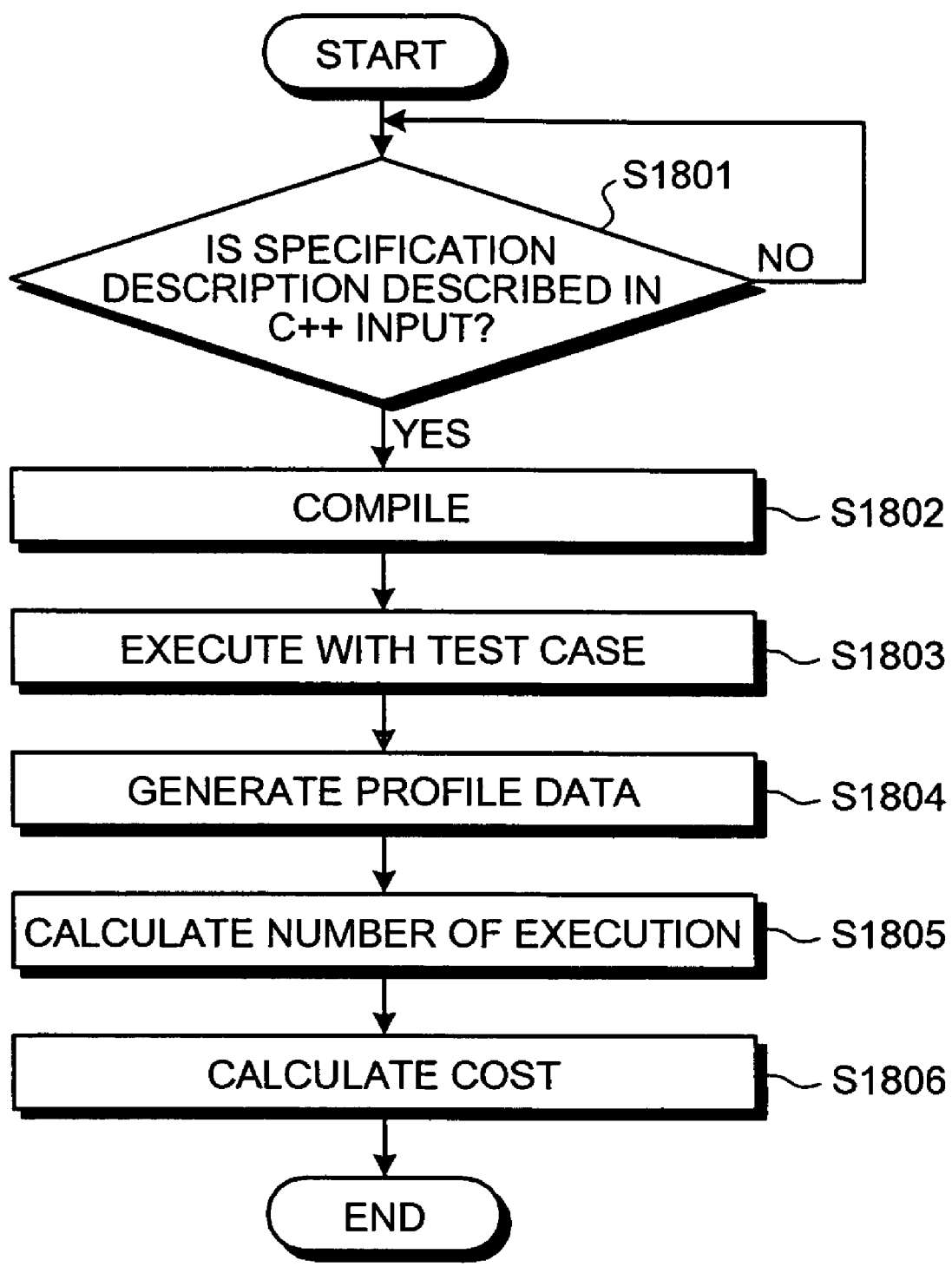
FIG. 18 is a flowchart of an example of a cost setting processing.

FIG. 18 is a flowchart of an example of a cost setting processing. In FIG. 18, if the specification description 200 described in the C++ language is input (step S1801: YES), the input specification description 200 is compiled to the executable model by the compiler such as gcc_pg (step S1802). Since the free command gprof is used for the profiler, "-pg" is added at the time of the compiling. "-pg" is a flag for using gprof.

The compiled executable model is executed by applying a test case (step S1803) to generate profile data (step S1804). From the generated profile data, the number of times of execution of the operation O1 to the operation O4 is calculated (step S1805). In this way, the costs W(V1) to W(V4) of the nodes V1 to V4 can be obtained. The cost of each link is calculated by summing the costs of a pair of nodes V coupled through each link E1 to E3 (step S 1806). The costs of the links can be set by the calculated costs.

Figure 19:
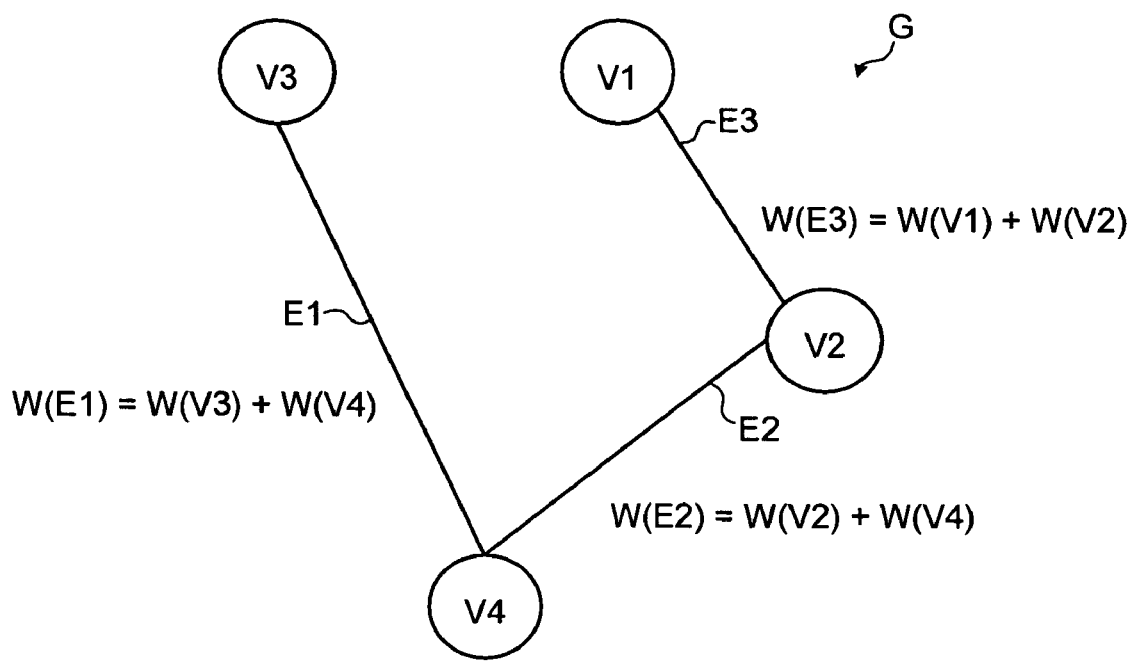
FIG. 19 is an explanatory diagram of a graph with costs set by the cost setting processing.
Figure 20:
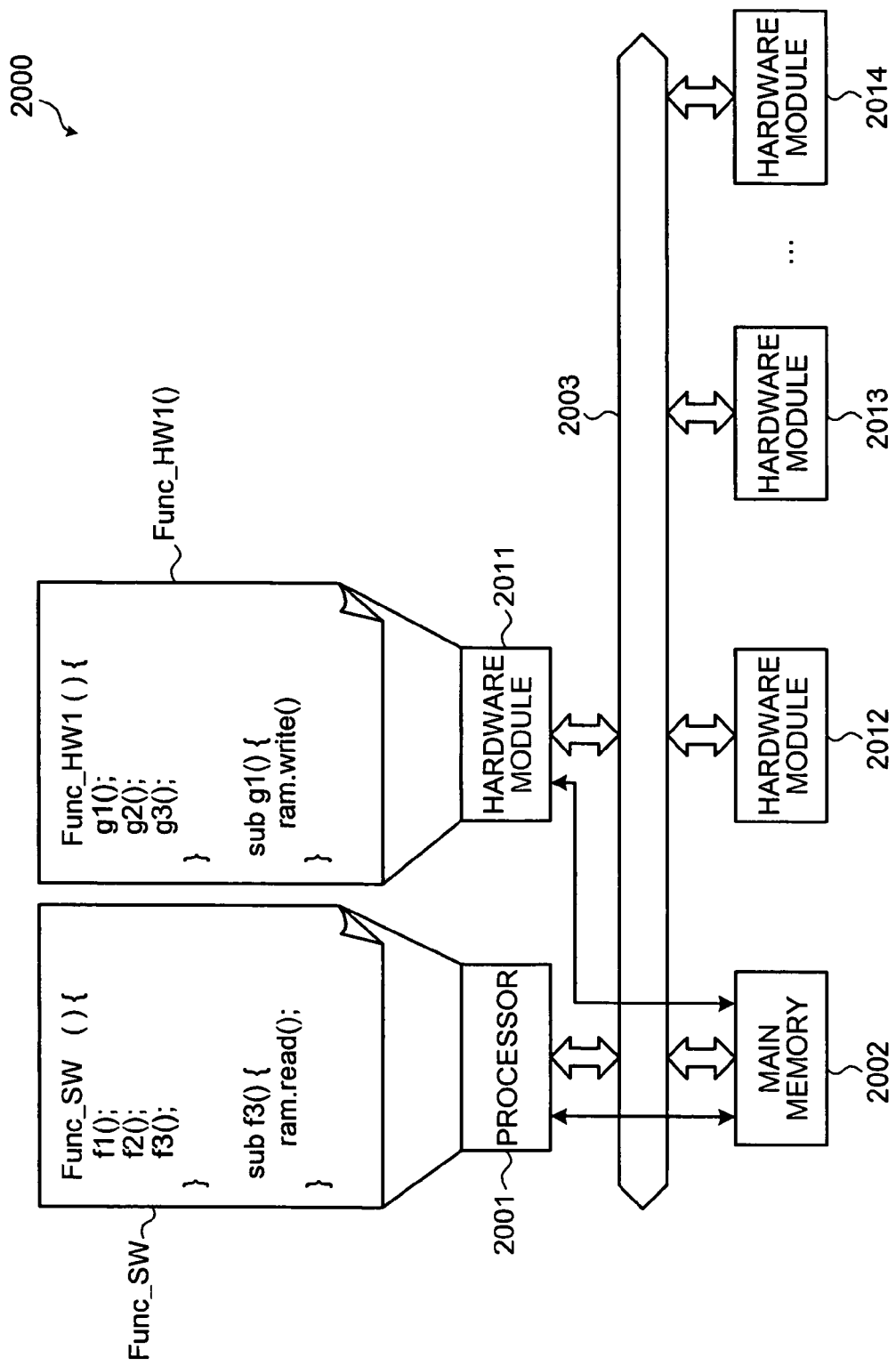
FIG. 20 is a block diagram of a hardware configuration of a conventional design target system.
Figure 21:
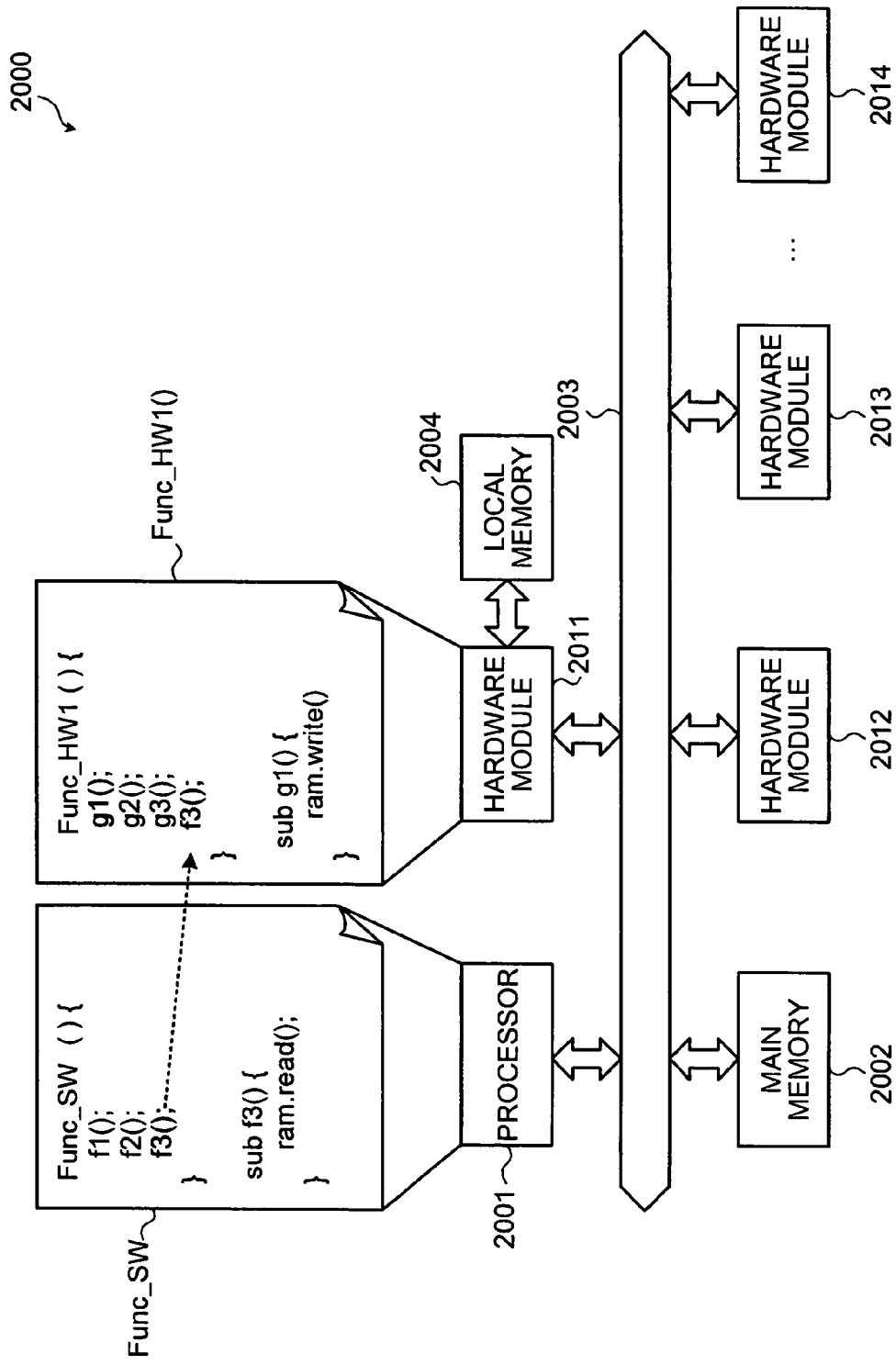
FIG. 21 is a block diagram of another example of a hardware configuration of a conventional design target system.

FIG. 19 is an explanatory diagram of a graph with the costs set by the cost setting processing. In the graph of FIG. 19, a cost W(E1) of the link E1 is a cost obtained by summing the cost W(V3) of the node V3 and the cost W(V4) of the node V4. A cost W(E2) of the link E2 is a cost obtained by summing the cost W(V2) of the node V2 and the cost W(V4) of the node V4. A cost W(E3) of the link E3 is a cost obtained by summing the cost W(V1) of the node V1 and the cost W(V2) of the node V2. In this way, the cost can be set with the emphasis on the number of times of the execution of each of the operation O1 to the operation O4 when the specification description is executed.

As described above, according to the design support apparatus 400 of the embodiment, the module division can be performed in consideration of a data transfer amount in the communication between modules. Therefore, each function module can be executed without generating the overhead and the performance of the design target can be improved. In a design operation site, changes in the design can be reduced which are caused because the customer's request is not satisfied by the final performance requirement of the design target system, for example, a mounting footprint or power consumption, and the design quality and the credibility can be improved. This reduces the redesign and the design period can be shortened.

The design support method described in the embodiment can be achieved by executing a program prepared in advance with a computer such as a personal computer or a workstation. The program is recorded on a computer-readable medium such as a hard disk, flexible disk, CD-ROM, MO, and DVD and is read from the recording medium by the computer for execution. The program may be a transmission medium that can be distributed through network such as the internet.

As described above, according to the present invention, since the requested specification description is converted to the graph constituted by the nodes and the links, the module division of the design object described by the specification description can be replaced with the graph division and the automation of the module division can be achieved. In this way, the design operation of the design object can be supported easily and efficiently.

Although the invention has been described with respect to a specific embodiment for a complete and clear disclosure, the appended claims are not to be thus limited but are to be construed as embodying all modifications and alternative constructions that may occur to one skilled in the art which fairly fall within the basic teaching herein set forth.

What is claimed is:

1. An apparatus for supporting design of a design object, comprising:

an input unit configured to input a specification description that includes a plurality of pieces of processing information, each piece indicative of a respective processing performed by the design object, and association information indicative of associations among the pieces of processing information;

a node generating unit configured to generate a node for each of the pieces of processing information, the node with which a chart schematically indicating a content of the specification description is formed;

a link generating unit configured to generate, based on the association information, a link that couples nodes generated by the node generating unit, the link with which the chart is formed;

a sub-chart generating unit configured to generate a plurality of sub-charts by dividing the chart into a plurality of charts, based on the node and the link;

a function-module generating unit to generate, for each of the sub-charts, a function module that executes a function based on the processing information corresponding to the node in the sub-chart and the association information corresponding to the link in the sub-chart;

a cost setting unit configured to set a cost based on a bit length of a common variable used in common in the processing between pieces of the processing information that correspond to a pair of the nodes coupled by the link; and a link extracting unit to extract a lowest link, having a lowest cost, from among links in the chart.

2. The apparatus according to claim 1, wherein:
the cost setting unit sets the cost based on the specification description, and the sub-chart generating unit generates the sub-charts based on the extracted link.

3. The apparatus according to claim 2, wherein the cost setting unit includes:
an execution-count calculating unit to calculate a number of times of execution of a processing indicated by the processing information; and
a cost calculating unit to calculate the cost based on the number of times of execution.

4. The apparatus according to claim 1, further comprising:
a condition input unit to input a condition on a number of the sub-charts to be generated; and
a determining unit to determine whether generated sub-charts satisfy the condition, wherein
the function-module generating unit generates the function module based on a result of determination by the determining unit.

5. The apparatus according to claim 4, further comprising:
a notifying unit to notify that division of the chart is impossible when the determining unit determines that the condition is not satisfied.

6. The apparatus according to claim 1, further comprising:
a condition input unit to input a condition on a number of the nodes in each sub-chart; and
a determining unit to determine whether generated sub-charts satisfy the condition, wherein
the function-module generating unit generates the function module based on a result of determination by the determining unit.

7. The apparatus according to claim 1, further comprising:
a condition input unit to input a condition that arbitrary processing information is to be included in a single function module; and
a determining unit to determine whether generated sub-charts satisfy the condition, wherein:
the function-module generating unit generates the function module based on a result of a determination by the determining unit.

8. The apparatus according to claim 1, further comprising:
a condition input unit to input a condition that arbitrary processing information is not to be included in a single function module; and
a determining unit to determine whether generated sub-charts satisfy the condition, wherein:
the function-module generating unit generates the function module based on a result of a determination by the determining unit.

9. The apparatus according to claim 1, further comprising:
a communication-path specification-description generating unit to generate, based on the function modules, a specification description for a communication path connecting a plurality of the function modules.

10. A method of supporting design of a design object, comprising:
inputting a specification description that includes a plurality of pieces of processing information, each indicative of a processing performed by the design object and association information indicative of associations among the pieces of processing information;
generating, by using a computer, a node for each of the pieces of processing information, the node with which a chart schematically indicating a content of the specification description is formed;
generating, based on the association information, a link that couples nodes generated by the node generating unit, the link with which the chart is formed;
generating a plurality of sub-charts by dividing the chart into a plurality of charts, based on the node and the link;
generating, for each of the sub-charts, a function module that executes a function based on the processing information corresponding to the node in the sub-chart and the association information corresponding to the link in the sub-chart;
setting a cost based on a bit length of a common variable used in common in the processing between pieces of the processing information that correspond to a pair of the nodes coupled by the link;
generating, based on the function module for each of the subcharts, a specification description for a communication path connecting a plurality of the function modules,
extracting a lowest link, having a lowest cost, from among links in the chart.

11. A computer-readable recording medium that stores therein a computer program to support design of a design object, the computer program controlling the computer to execute:
inputting a specification description that includes a plurality of pieces of processing information, each indicative of a processing performed by the design object and association information indicative of associations among the pieces of processing information;
generating a node for each of the pieces of processing information, the node with which a chart schematically indicating a content of the specification description is formed;
generating, based on the association information, a link that couples nodes generated by the node generating unit, the link with which the chart is formed;
generating a plurality of sub-charts by dividing the chart into a plurality of sub-charts, based on the node and the link;
generating, for each of the sub-charts, a function module that executes a function based on the processing information corresponding to the node in the sub-chart and the association information corresponding to the link in the sub-chart;
setting a cost based on a bit length of a common variable used in common in the processing between pieces of the processing information that correspond to a pair of the nodes coupled by the link; and
extracting a lowest link, having a lowest cost, from among links in the chart.

* * * * *

UNITED STATES PATENT AND TRADEMARK OFFICE
CERTIFICATE OF CORRECTION

PATENT NO. : 7,752,576 B2
APPLICATION NO. : 11/394390
DATED : July 6, 2010
INVENTOR(S) : Qiang Zhu et al.

It is certified that error appears in the above-identified patent and that said Letters Patent is hereby corrected as shown below:

Column 1, Line 8, delete "35U.S.C §111(a),of" and insert --35 U.S.C §111(a), of--.

Column 1, Lines 8-9, delete "PCT/JP2003/013664," and insert --PCT/JP2003/013994,--.

Column 14, Line 23, delete "subcharts," and insert --sub-charts,--.

Column 14, Line 24, delete "modules," and insert --modules; and--.

Signed and Sealed this
Fifth Day of April, 2011

David J. Kappos
*Director of the United States Patent and Trademark Office*